United States Patent
Huang et al.

(10) Patent No.: US 7,576,609 B1
(45) Date of Patent: Aug. 18, 2009

(54) PREAMPLIFIER FOR RECEIVER AND METHOD THEREOF

(75) Inventors: Chih-Haur Huang, Tainan County (TW); Chung-Ming Huang, Tainan County (TW)

(73) Assignee: Himax Technologies Limited, Tainan County (TW)

(*) Notice: Subject to any disclaimer, the term of this patent is extended or adjusted under 35 U.S.C. 154(b) by 27 days.

(21) Appl. No.: 12/071,485

(22) Filed: Feb. 21, 2008

(51) Int. Cl.
*H03F 3/45* (2006.01)

(52) U.S. Cl. .................................. 330/258; 330/255

(58) Field of Classification Search ............... 330/258, 330/257, 51, 261, 255
See application file for complete search history.

(56) References Cited

U.S. PATENT DOCUMENTS

| 4,616,189 | A  | * | 10/1986 | Pengue, Jr. ............... 330/253 |
| 4,904,953 | A  | * | 2/1990  | McCormack ............. 330/258 |
| 7,053,712 | B2 | * | 5/2006  | Bonaccio et al. ......... 330/258 |
| 7,113,017 | B2 | * | 9/2006  | Owen ....................... 327/333 |
| 7,221,190 | B2 | * | 5/2007  | Partow et al. ............. 327/65 |

* cited by examiner

*Primary Examiner*—Henry K Choe
(74) *Attorney, Agent, or Firm*—Rabin & Berdo, P.C.

(57) ABSTRACT

A preamplifier used in a receiver is provided. The preamplifier comprises an input circuit and an output circuit. The input circuit receives an input differential voltage pair, pulls it down when the common voltage of the input differential voltage pair is higher than a reference voltage. The output circuit receives the input differential voltage pair outputted from the input circuit to pull high or low an output voltage accordingly.

19 Claims, 3 Drawing Sheets

PREAMPLIFIER FOR RECEIVER AND METHOD THEREOF

BACKGROUND OF THE INVENTION

1. Field of the Invention

The invention relates in general to a preamplifier for a receiver and a method thereof, and more particularly to a preamplifier with wide range of the common voltage of the input differential voltage pair.

2. Description of the Related Art

FIG. 1 is a circuit diagram of a conventional rail-to-rail preamplifier for a receiver. The conventional rail-to-rail preamplifier 100 includes amplifiers 110 and 120 and an inverter 130. The amplifiers 110 and 120 each amplify a differential voltage pair VN and VP and produce one voltage of the amplified differential voltage pair for the inverter 130. The inverter 130 then pulls its output voltage Vo high or low based on these inputs. The transistors in amplifiers 110 and 120 are complementary, so that the preamplifier 100 is capable of amplifying the differential voltage VN and VP with wide common voltage range.

However, the amplifiers 110 and 120 are powered by a high voltage supply power HVDD, which is for analog power, while the inverter 130 is powered by a low voltage supply power LVDD, which is for digital power. The high supply voltage HVDD is around 3.3V, and the low supply voltage LVDD is around 1.8V. The low supply voltage LVDD is even lower than the high supply voltage HVDD minus a threshold voltage of a transistor 121 in amplifier 120. Thus, the transistor 131 in the inverter 130 is cut off, which causes the rail-to-rail preamplifier to become disabled.

SUMMARY OF THE INVENTION

A preamplifier used in a receiver includes an input circuit, an output circuit. The input circuit receives an input differential voltage pair and pulls it down when the common voltage of the input differential voltage pair is higher than a reference voltage. The output circuit receives the input differential voltage pair outputted from the input circuit to pull high or low an output voltage accordingly.

A preamplifier used in a receiver includes an input circuit and an amplifier. The input circuit receives an input differential voltage pair, pulls it down when the common voltage of the input differential voltage pair is higher than a reference voltage, and keeps it unchanged when the common voltage is not higher than the reference voltage. The amplifier includes a first stage amplifier and a second stage amplifier. The first stage amplifier, powered by a high supply voltage, receives and amplifies the input differential voltage pair outputted from the input circuit to output an internal differential voltage pair. The second stage amplifier, powered by a low supply voltage, receives and amplifies the internal differential voltage pair to pull high or low an output voltage.

A method for preamplifying an input differential voltage pair, used in a receiver, includes the following steps. Firstly, the input differential voltage pair is pulled down when the common voltage of the input differential voltage pair is higher than a reference voltage. Next, the input differential voltage pair is amplified to output an internal differential voltage pair. Then, the internal differential voltage pair is amplified to pull high or low a first output voltage.

DETAILED DESCRIPTION OF THE INVENTION

First Embodiment

Figure 1:
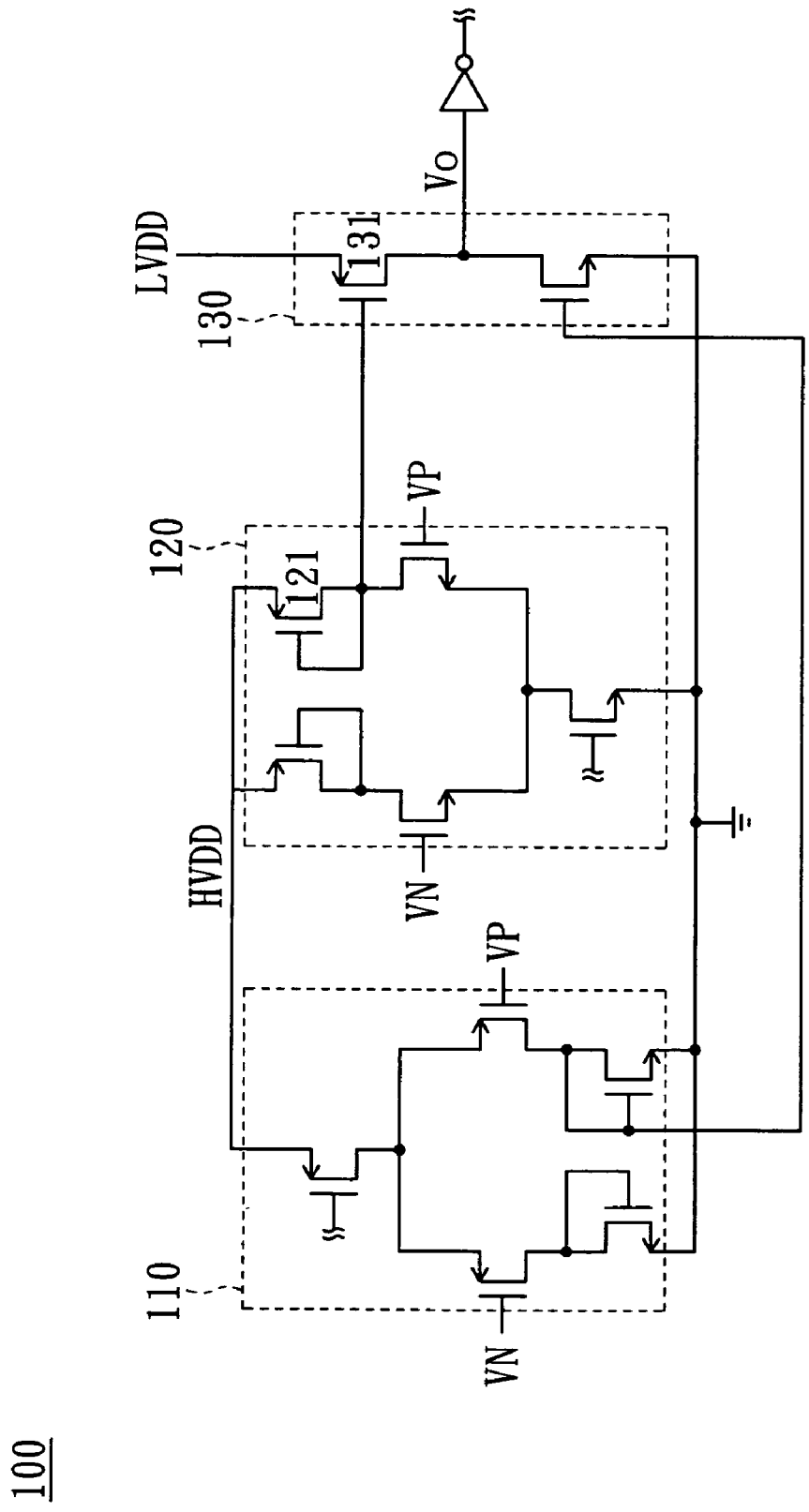
FIG. 1 is a circuit diagram of a conventional rail-o-rail preamplifier for a receiver.
Figure 2:
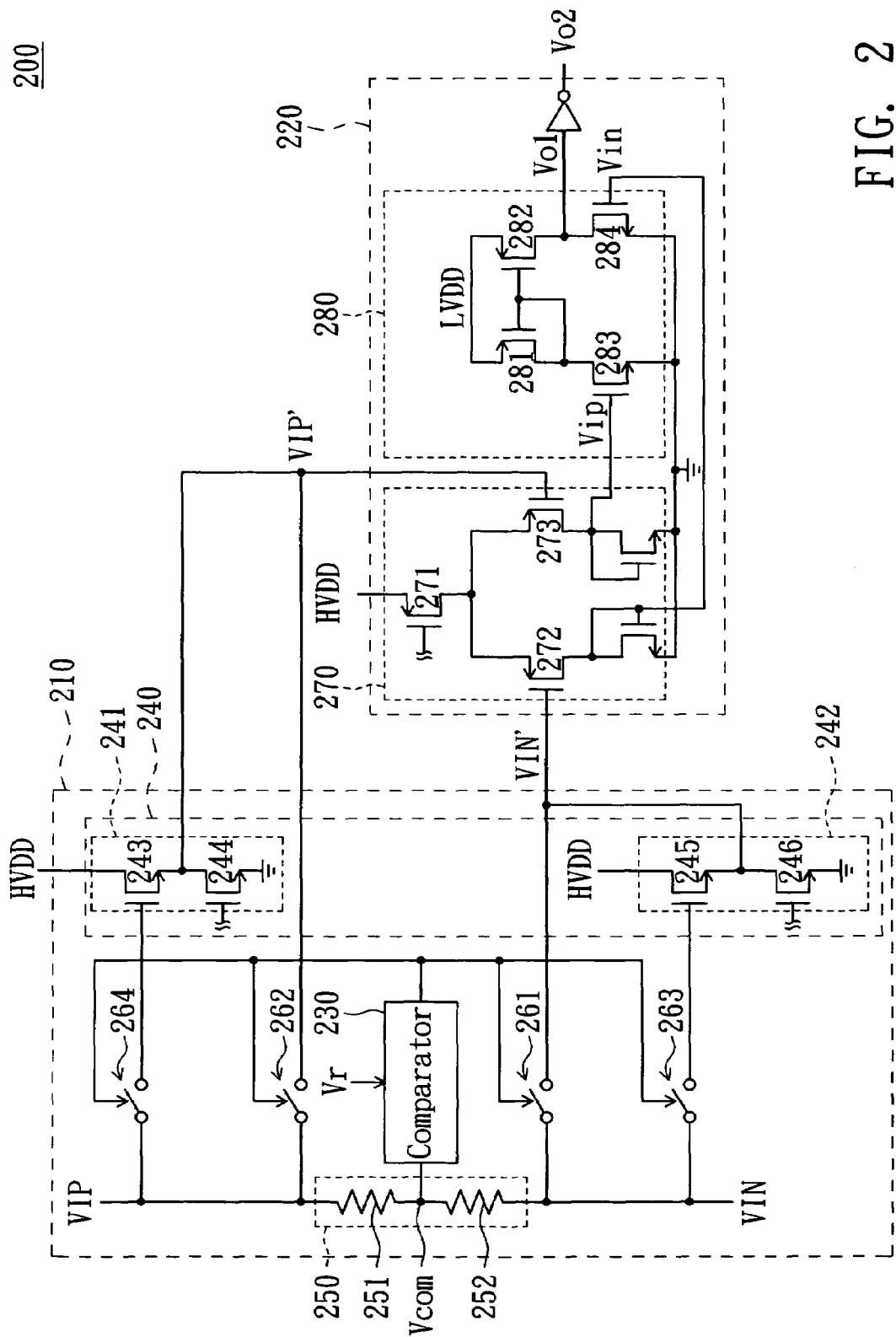
FIG. 2 shows a circuit diagram of the preamplifier according to a first embodiment of the invention.

FIG. 2 shows a circuit diagram of the preamplifier 200 according to the first embodiment of the invention. The preamplifier 200 is for preamplifying an input differential voltage pair VIN and VIP to pull an output voltage Vo1 for a receiver high or low.

The preamplifier 200 includes an input circuit 210 and an output circuit 220. The input circuit 210 receives the input differential voltage pair VIN and VIP. In the first embodiment, when the common voltage Vcom of the input differential voltage pair VIN and VIP is higher than a reference voltage Vr, the input circuit 210 pulls the input differential voltage pair VIN and VIP down to produce a differential voltage pair VIN' and VIP' and then transfers the differential voltage pair VIN' and VIP' to the output circuit 220.

When the common voltage Vcom of the input differential voltage pair VIN and VIP is not higher than the reference voltage Vr, the input circuit 210 directly transfers the input differential voltage pair VIN and VIP as the input differential voltage pair VIN' and VIP' to the output circuit 220 without pulling the input differential voltage pair VIN and VIP down. The output circuit 220 then takes the input differential voltage pair VIN' and VIP' and pulls the output voltage Vo1 high or low.

The input circuit 210 is now described in detail. The input circuit 210 includes a comparator 230 and a level adjustment circuit 240 and switches 261, 262, 263 and 264. The comparator 230 compares the common voltage Vcom of the input differential voltage pair VIN and VIP with the reference voltage Vr. The switches 261 to 264 are turned on or off based on the comparing result of the comparator 230.

When the common voltage Vcom is higher than the reference voltage Vr, the switches 263 and 264 are turned on to transmit the input differential voltage pair VIN and VIP to the level adjustment circuit 240. Meanwhile, the switches 261 and 262 are turned off with the result that the input differential voltage pair will not be directly transmitted to the output circuit 220. The level adjustment circuit 240 then pulls the input differential voltage pair VIN and VIP down. The pulled-down input differential voltage pair VIN and VIP is then transferred to the first stage amplifier 270 in the output circuit 220.

In this embodiment, the level adjustment circuit 240 includes source followers 241 and 242, which are for pulling down the voltages VIN and VIP, respectively, of the input differential voltage pair when the common voltage Vcom is higher than the reference voltage Vr. The source follower 241 includes transistors 243 and 244. When the common voltage Vcom is higher than the reference voltage Vr, the gate of the transistor 243 receives the voltage VIP. The drain of the transistor 243 receives the high supply voltage HVDD and its source is connected to the drain of the transistor 244. The transistor 244 has its source grounded.

When the transistor 243 receives the voltage VIP, the transistor 243 pulls down the voltage VIP by an amount equal to its gate-source cross voltage to produce the voltage VIP' at its source which is connected to the output circuit 220.

Similarly, when the common voltage Vcom is higher than the reference voltage Vr, the gate of the transistor 245 receives the voltage VIN. Then the transistor 245 pulls down the voltage VIN by an amount equal to its gate-source cross voltage to produce the voltage VIN' at its source which is connected to the output circuit 220.

When the common voltage Vcom is not higher than the reference voltage Vr, the switches 261 and 262 are turned on to transfer the voltages VIN and VIP to the output circuit 220 as the voltages VIN' and VIP', respectively. Meanwhile, the switches 263 and 264 are turned off with the result that the level adjustment circuit 240 will not receive the input differential voltage pair VIN and VIP. Therefore, when the common voltage Vcom is not higher than the reference voltage Vr, the input differential voltage pair VIN and VIP is not pulled down but directly transferred to the output circuit 220.

In this embodiment, the input circuit 210 further includes a voltage divider 250 to generate the common voltage Vcom of the input differential voltage pair VIN and VIP to the comparator 230. In the first embodiment, the voltage divider 250 is a resistor string including resistors 251 and 252 which are serially connected. The voltage divider 250 is coupled between the voltage VIN and the voltage VIP to divide the voltage therebetween. In the first embodiment, the resistances of the resistors 251 and 252 are the same. Thus, the common voltage Vcom of the input differential voltage pair VIN and VIP is produced at the connection of the resistors 251 and 252.

The output circuit 220 is now described in detail. In the first embodiment, the output circuit 220 is an amplifier. The output circuit 220 includes a first stage amplifier 270 and a second stage amplifier 280. In the first embodiment, the first stage amplifier 270 is powered by the high supply voltage HVDD, which is for analog power, while the second stage amplifier 280 is powered by the low supply voltage LVDD, which is for digital power. The first stage amplifier 270 receives and amplifies the input differential voltage pair VIN' and VIP' produced by the input circuit 210 and produces an internal differential voltage pair Vin and Vip. The second stage amplifier 280 receives and amplifies the internal differential voltage pair Vin and Vip to pull the output voltage Vo1 high or low.

The first stage amplifier 270 includes transistors 271, 272, 273. The transistor 271 is for receiving the high supply voltage HVDD and providing a bias current for the first stage amplifier 270. The transistors 272 and 273 are for receiving the voltages VIN' and VIP', respectively. The source-drain cross voltage of the transistor 271 is Vsd. The source-gate cross voltage of the transistors 272 and 273 are Vsg.

The second stage amplifier 280 includes transistors 281, 282, 283, and 284. The transistors 281 and 282 form a current mirror. The transistors 283 and 284 receive the voltage Vip and Vin, respectively.

In the first embodiment, the output circuit 220 further includes an inverter 290 for amplifying the output voltage Vo1 to produce an inverted output voltage Vo2.

When the voltage VIP is higher than the voltage VIN, that is, the voltage VIP' is higher than the voltage VIN', the amplifier 280 pulls the output voltage Vo1 low, and the inverter 290 then pulls the output voltage Vo2 high. When the voltage VIP is lower than the voltage VIN, that is, the voltage VIP' is lower than the voltage VIN', the amplifier 280 pulls the output voltage Vo1 high and the inverter 290 then pulls the output voltage V02 low.

Therefore, the preamplifier 200 receives the input differential voltage pair VIN and VIP and pulls the output voltages Vo1 and Vo2 high or low according to the input differential voltage.

However, when the common voltage of the input differential voltage pair VIN' and VIP' is higher than the voltage HVDD-Vsd-Vsg, the transistors 272 and 273 will be cut off, which causes the output circuit 220 to be disabled. Therefore, by applying the input circuit 210, which pulls down the input differential voltage pair VIN and VIP when the common voltage Vcom of the input differential voltage pair VIN and VIP is too high, the transistors 272 and 273 are therefore enabled to receive the pulled-down input differential voltage VIN' and VIP' so as to be kept turned on.

In the first embodiment, the reference voltage Vr is set to about HVDD/2, which ensures that the pulled down input differential voltage pair VIN' and VIP' are not to cut off to the transistors 272 and 273.

Conversely, when the common voltage Vcom of the input differential voltage pair VIN and VIP is not higher than the reference voltage Vr, the input circuit 210 simply reproduces VIN and VIP as the differential voltage pair VIN' and VIP' at its output, in which case the transistors 272 and 273 will not be cut off.

Therefore, even if the common voltage Vcom of the input differential voltage pair VIN and VIP is high, the common voltage of the input differential voltage pair VIN' and VIP' produced by the input circuit 210 will not be higher than the voltage HVDD-Vsd-Vsg, so that the output circuit 220 works properly. Thus, the preamplifier 200 according to the first embodiment is capable of properly preamplifying the input differential voltage pair even with wide range of common voltage.

Second Embodiment

Figure 3:
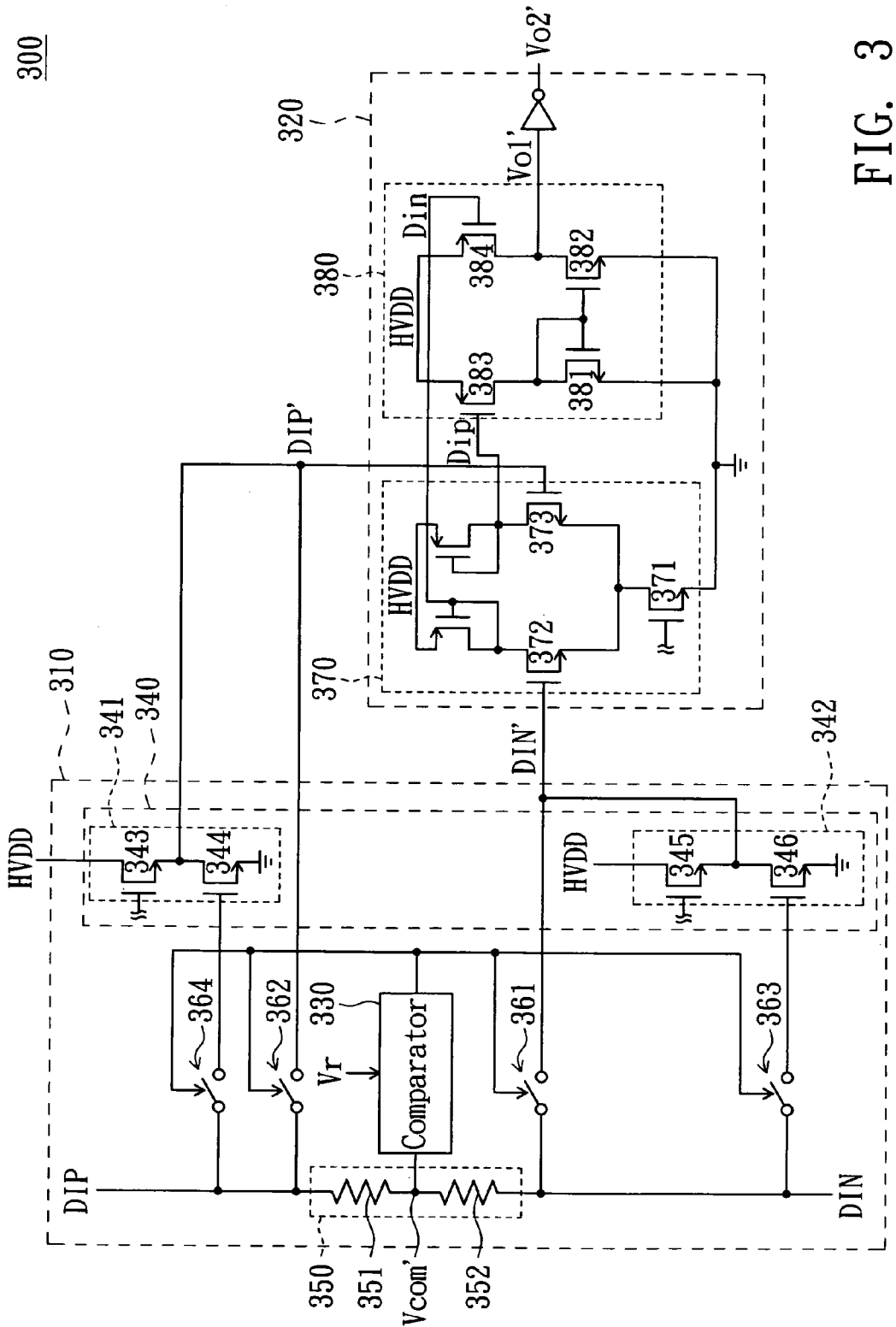
FIG. 3 shows a circuit diagram of the preamplifier according to a second embodiment of the invention.

FIG. 3 shows a circuit diagram of the preamplifier 300 according to the second embodiment. In the second embodiment, when the common voltage Vcom' of the input differential voltage pair DIN and DIP is lower than a reference voltage Vr', the input circuit 310 pulls the input differential voltage pair DIN and DIP up to produce a differential voltage pair DIN' and DIP' and then transfers the differential voltage pair DIN' and DIP' to the output circuit 320.

When the common voltage Vcom' of the input differential voltage pair DIN and DIP is not lower than the reference voltage Vr', the input circuit 310 directly transfers the input differential voltage pair DIN and DIP as the input differential voltage pair DIN' and DIP' to the output circuit 320 without pulling the input differential voltage pair DIN' and DIP' up. The output circuit 320 then takes the input differential voltage pair DIN' and DIP' and pulls the output voltage Vo1' high or low.

The detailed description of the input circuit 310 is explained as follows. In the input circuit 310, when the common voltage Vcom' is lower than the reference voltage Vr', the switches 363 and 364 are turned on to transmit the input differential voltage pair DIN and DIP to the source followers 342 and 341 in the level adjustment circuit 340, respectively. Meanwhile, the switches 361 and 362 are turned off. The transistors 346 and 344 in the source followers 342 and 341 then pulls the voltages DIN and DIP up, respectively, by amounts equal to the gate-drain cross voltages of the transistors 346 and 344. The pulled-up input differential voltage pair DIN' and DIP' is then transferred to the first stage amplifier 370 in the output circuit 320.

In the input circuit 310, when the common voltage Vcom' is not lower than the reference voltage Vr', the switches 361 and 362 are turned on to transmit the voltage DIN and DIP as the voltage DIN' and DIP' directly to the output circuit 320. Meanwhile, the switches 363 and 364 are turned off, so that the level adjustment circuit 340 will not receive the input differential voltage pair DIN and DIP.

In the output circuit 320, the first and second stage amplifiers 370 and 380 are both powered by the same supply voltage, for example, one of the high and low supply voltages HVDD and LVDD. The functions of transistors 371 to 373 in the first stage amplifier 370 in FIG. 3 are similar to the function of the transistors 271 to 273 in the first stage amplifier 270 in FIG. 2, respectively. The functions of the transistors 381 to 384 are similar to those of the transistors 281 to 284, respectively. The corresponding transistors in the output circuits 320 and 220 are complementary. For example, the transistor 371 is NMOS, while its corresponding transistor 271 is PMOS. The function of the inverter 390 is similar to that of the inverter 290.

In the output circuit 320, the drain-source cross voltage of the transistor 371 is Vds, and the gate-source cross voltage of the transistors 372 and 373 are Vgs. When the common voltage of the input differential voltage pair DIN' and DIP' is lower than the voltage equal to Vds+Vgs, the transistors 372 and 373 will be cut off, which causes the output circuit 320 to be disabled. Therefore, by applying the input circuit 310, which pulls up the input differential voltage pair DIN and DIP when the common voltage Vcom' of the input differential voltage pair DIN and DIP is too low, the transistors 372 and 373 therefore receive the pulled-up input differential voltage DIN' and DIP' so as to be kept turned on.

Consequently, even if the common voltage Vcom' of the input differential voltage pair DIN and DIP is too low, the common voltage of the input differential voltage pair DIN' and DIP' produced by the input circuit 310 will not be lower than the voltage Vds+Vgs, so that the output circuit 320 works properly. Thus, the preamplifier 300 according to the second embodiment is capable of properly preamplifying the input differential voltage pair even with wide range of common voltage.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A preamplifier used in a receiver, comprising:
    an input circuit receiving an input differential voltage pair, pulling it down when the common voltage of the input differential voltage pair is higher than a reference voltage; and
    an output circuit receiving the input differential voltage pair outputted from the input circuit to pull high or low an output voltage accordingly.

2. The preamplifier according to claim 1, wherein the input circuit keeps the input differential voltage pair unchanged when the common voltage of the input differential voltage pair is not higher than the reference voltage.

3. The preamplifier according to claim 1, wherein the input circuit comprises:
    a comparator comparing the common voltage of the input differential voltage pair with the reference voltage; and
    a level adjustment circuit pulling down the input differential voltage pair when the common voltage of the input differential voltage pair is higher than the reference voltage.

4. The preamplifier according to claim 3, wherein the level adjustment circuit comprises two source followers, each of which pulling down one voltage of the input differential voltage pair when the common voltage is higher than the reference voltage.

5. The preamplifier according to claim 3, wherein the input circuit comprising a voltage divider generating the common voltage of the input differential voltage pair to the comparator.

6. The preamplifier according to claim 3, wherein the input circuit comprises a first switch, a second switch, a third switch and a fourth switch, the first and the second switches transfer the input differential voltage pair to the level adjustment circuit when the common voltage is higher than the reference voltage, the third and the fourth switches transfer the differential voltage pair directly to the output circuit when the common voltage is not higher than the reference voltage.

7. The preamplifier according to claim 1, wherein the output circuit comprises:
    a first stage amplifier, powered by a high supply voltage, receiving the input differential voltage pair outputted from the input circuit and amplifying the input differential voltage pair to output an internal differential voltage pair; and
    a second stage amplifier, powered by a low supply voltage and amplifying the internal differential voltage pair to pull high or low a first output voltage.

8. The preamplifier according to claim 1, wherein the output circuit further comprises:
    an inverter pulling high or low a second output voltage based on the first output voltage.

9. A preamplifier used in a receiver, comprising:
    an input circuit receiving an input differential voltage pair, pulling it down when the common voltage of the input differential voltage pair is higher than a reference voltage, and keeping it unchanged when the common voltage is not higher than the reference voltage; and
    an amplifier comprising:
        a first stage amplifier, powered by a high supply voltage, for receiving and amplifying the input differential voltage pair outputted from the input circuit to output an internal differential voltage pair; and
        a second stage amplifier, powered by a low supply voltage, for receiving and amplifying the internal differential voltage pair to pull high or low an output voltage.

10. The preamplifier according to claim 9, wherein the input circuit comprises:
    a comparator comparing the common voltage of the input differential voltage pair with the reference voltage; and
    a level adjustment circuit pulling down the input differential voltage pair when the common voltage of the input differential voltage pair is higher than the reference voltage.

11. The preamplifier according to claim 10, wherein the level adjustment circuit comprises two source followers, each of which pulling down one voltage of the input differential voltage pair when the common voltage is higher than the reference voltage.

12. The preamplifier according to claim 10, wherein the input circuit comprising a voltage divider generating the common voltage of the input differential voltage pair to the comparator.

13. The preamplifier according to claim 10, wherein the input circuit comprises a first switch, a second switch, a third switch and a fourth switch, the first and the second switches transfer the input differential voltage pair to the level adjustment circuit when the common voltage is higher than the reference voltage, the third and the fourth switches transfer the differential voltage pair directly to the output circuit when the common voltage is not higher than the reference voltage.

14. The preamplifier according to claim 9, wherein the output circuit further comprises:
- an inverter pulling high or low a second output voltage based on the first output voltage.

15. A method for preamplifying an input differential voltage pair, used in a receiver, comprising:
- pulling down the input differential voltage pair when the common voltage of the input differential voltage pair is higher than a reference voltage;
- amplifying the input differential voltage pair to output an internal differential voltage pair; and
- amplifying the internal differential voltage pair to pull high or low a first output voltage.

16. The method according to claim 15, wherein before the step of amplifying the input differential voltage pair, the method further comprises:
when the common voltage of the input differential voltage pair is not higher than the reference voltage, keep the input differential voltage pair unchanged.

17. The method according to claim 15, wherein in the step of amplifying the input differential voltage pair, amplify the input differential voltage pair to output an internal differential voltage pair by a first stage amplifier powered by a high supply voltage.

18. The method according to claim 15, wherein in the step of amplifying the internal differential voltage pair, amplify the internal differential voltage pair by a second stage amplifier powered by a low supply voltage.

19. The method according to claim 15, wherein the method further comprises:
- amplifying the first output voltage to pull high or low a second output voltage.

* * * * *